US010084412B2

(12) United States Patent
Lei et al.

(10) Patent No.: US 10,084,412 B2
(45) Date of Patent: Sep. 25, 2018

(54) CHARGE-STEERING AMPLIFIER CIRCUIT AND CONTROL METHOD THEREOF

(71) Applicant: REALTEK SEMICONDUCTOR CORPORATION, Hsinchu (TW)

(72) Inventors: Liang-Huan Lei, Kaohsiung (TW); Cheng-Pang Chan, Hsinchu County (TW); Chih-Lung Chen, Hsinchu County (TW); Shih-Hsiung Huang, Miaoli County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/711,700

(22) Filed: Sep. 21, 2017

(65) Prior Publication Data
US 2018/0191307 A1    Jul. 5, 2018

(30) Foreign Application Priority Data
Jan. 4, 2017   (TW) .............................. 106100157 A

(51) Int. Cl.
*H03F 3/45*    (2006.01)
*H03F 1/02*    (2006.01)
*G11C 27/02*   (2006.01)

(52) U.S. Cl.
CPC ......... *H03F 1/0205* (2013.01); *G11C 27/026* (2013.01); *H03F 3/45179* (2013.01); *H03F 2200/555* (2013.01); *H03F 2203/45116* (2013.01); *H03F 2203/45212* (2013.01)

(58) Field of Classification Search
CPC ....................................................... H03F 3/45
USPC .............................................. 330/261, 253, 9
See application file for complete search history.

(56) References Cited

U.S. PATENT DOCUMENTS

| | | | | | |
|---|---|---|---|---|---|
| 5,973,536 | A | * | 10/1999 | Maejima | H03H 19/004 327/336 |
| 6,097,248 | A | * | 8/2000 | Segami | H03F 3/005 327/124 |
| 7,579,885 | B2 | * | 8/2009 | Rossi | H03F 3/005 327/124 |

(Continued)

OTHER PUBLICATIONS

Shiuh-Hua Wood Chiang et al., A 10-Bit 800-MHz 19-mW CMOS ADC, IEEE Journal of Solid-State Circuits, vol. 49, No. 4, Apr. 2014.

(Continued)

*Primary Examiner* — Henry Choe
(74) *Attorney, Agent, or Firm* — WPAT, PC

(57) ABSTRACT

This disclosure provides a charging-steering amplifier circuit and the control method thereof. The charging-steering amplifier circuit includes a charging-steering differential amplifier and a sample and hold circuit. The charging-steering amplifier circuit operates in a reset phase or in an amplifying phase to amplify a differential input signal. The control method includes steps of: in the reset phase, obtaining a common mode voltage of the differential input signal according to the differential input signal; in the reset phase, providing the common mode voltage to one of the charging-steering differential amplifier and the sample and hold circuit; in the reset phase, sampling the differential input signal by the sample and hold circuit to generate a voltage signal; and in the amplifying phase, inputting the voltage signal to the charging-steering differential amplifier.

10 Claims, 10 Drawing Sheets

(56) References Cited

U.S. PATENT DOCUMENTS 7,639,073 B2 * 12/2009 Deng .................. H03F 3/005
330/69
8,922,275 B2 * 12/2014 Thomas .............. H03F 3/45475
330/69

OTHER PUBLICATIONS

Alessandro Venca et al., A 0.076 mm^ 2 12 b 26.5 mW 600 MS/s 4-Way Interleaved Subranging SAR-ADC With On-Chip Buffer in 28 nm CMOS, IEEE Journal of Solid-State Circuits.
James Lin et al., A 15.5 dB, Wide Signal Swing, Dynamic Amplifier Using a Common-Mode Voltage Detection Technique, 2011 IEEE.
Behzad Razavi, Charge Steering: A Low-Power Design Paradigm, Custom Integrated Circuits Conference (CICC), 2013 IEEE.

\* cited by examiner

CHARGE-STEERING AMPLIFIER CIRCUIT AND CONTROL METHOD THEREOF

BACKGROUND

1. Field of the Disclosure

The present disclosure generally relates to a charge-steering amplifier, and more particularly to an amplifier circuit implemented by a charge-steering amplifier.

2. Description of Related Art

FIG. 1 shows a circuit diagram of a conventional charge-steering differential amplifier. The charge-steering differential amplifier 100 is also known as a dynamic amplifier, which mainly includes transistors 110 and 120, as well as switches 130 to 160 and capacitors 170 to 190. The connection of the components is shown in FIG. 1. The charge-steering differential amplifier 100 operates in a reset phase ($\Phi_s$) or in an amplification phase ($\Phi_h$) to amplify the differential input signal $V_i$ and accordingly generate the output signal $V_o$. The switches 130, 140 and 150 are turned off in the reset phase and are turned on in the amplification phase, while the switch 160 is turned on in the reset phase and is turned off in the amplification phase. The operational details of the charge-steering differential amplifier 100 are well known to those skilled in the art and are omitted herein for brevity. Note that the gain of the charge-steering differential amplifier 100 is closely associated with the gate-source voltages ($V_{gs}$) of the transistors 110 and 120. Therefore, any slight perturbation in the common mode voltage of the differential input signal $V_i$ causes a considerable impact on the output signal $V_o$, which degrades the performance of the charge-steering differential amplifier 100.

SUMMARY

In view of the issues of the prior art, an object of the present disclosure is to provide a charge-steering amplifier circuit and a control method thereof, so as to improve the efficiency and stability of the charge-steering amplifier circuit.

A charge-steering amplifier circuit operating in a reset phase or in an amplification phase to amplify a differential input signal is provided. The charge-steering amplifier circuit includes a sample and hold circuit, a charge-steering differential amplifier, and a reference voltage generating circuit. The sample and hold circuit includes a capacitor and samples the differential input signal to generate a voltage signal. The charge-steering differential amplifier includes a transistor, a switch and a capacitor. The transistor has a first end receiving the voltage signal and a second end serving as an output terminal of the charge-steering differential amplifier. The switch is turned off in the reset phase and turned on in the amplification phase. The capacitor is coupled to a third end of the transistor through the switch. The reference voltage generating circuit, which is coupled to the charge-steering differential amplifier, generates a reference voltage according to the differential input signal and outputs the reference voltage to the capacitor in the reset phase. The reference voltage is associated with a common mode voltage of the differential input signal.

A charge-steering amplifier circuit operating in a reset phase or in an amplification phase to amplify a differential input signal is also provided. The charge-steering amplifier circuit includes a charge-steering differential amplifier, a sample and hold circuit, and a reference voltage generating circuit. The charge-steering differential amplifier receives a voltage signal through an input terminal. The sample and hold circuit is coupled to the charge-steering differential amplifier and samples the differential input signal to generate the voltage signal. The sample and hold circuit includes a capacitor having a first end and a second end, and multiple switches which are turned on or off according to the reset phase and the amplification phase. The reference voltage generating circuit, which is coupled to the sample and hold circuit, generates a first reference voltage according to the differential input signal. The first reference voltage is associated with a common mode voltage of the differential input signal. In the reset phase, the first end of the capacitor receives the differential input signal, and the second end of the capacitor is coupled to the first reference voltage. In the amplification phase, the first end of the capacitor is coupled to the input terminal, and the second end of the capacitor is coupled to a second reference voltage.

A control method of a charge-steering amplifier circuit is also provided. The charge-steering amplifier circuit includes a charge-steering differential amplifier and a sample and hold circuit, and the charge-steering amplifier circuit operates in a reset phase or an amplification phase to amplify a differential input signal. The method includes steps of: in the reset phase, obtaining a common mode voltage of the differential input signal according to the differential input signal; in the reset phase, providing the common mode voltage to one of the charge-steering differential amplifier and the sample and hold circuit; in the reset phase, using the sample and hold circuit to sample the differential input signal to generate a voltage signal; and in the amplification phase, inputting the voltage signal to the charge-steering differential amplifier.

According to this disclosure, the charge-steering amplifier circuit and the control method thereof can effectively eliminate common mode perturbation, thus enhancing the performance and stability of the charge-steering amplifier circuit. Compared with the conventional technology, the charge-steering amplifier circuit and its control method of this disclosure eliminate the common mode perturbation in a feedforward manner, effectively preventing the common mode perturbation from entering the charge-steering differential amplifier of the charge-steering amplifier circuit.

These and other objectives of the present disclosure no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events. The disclosure herein includes a charge-steering amplifier circuit and a control method of the charge-steering amplifier circuit. Some or all of the processes of the control method may be implemented by software and/or firmware in cooperation with hardware, and can be performed by the charge-steering amplifier circuit or its equivalent.

Figure 1:
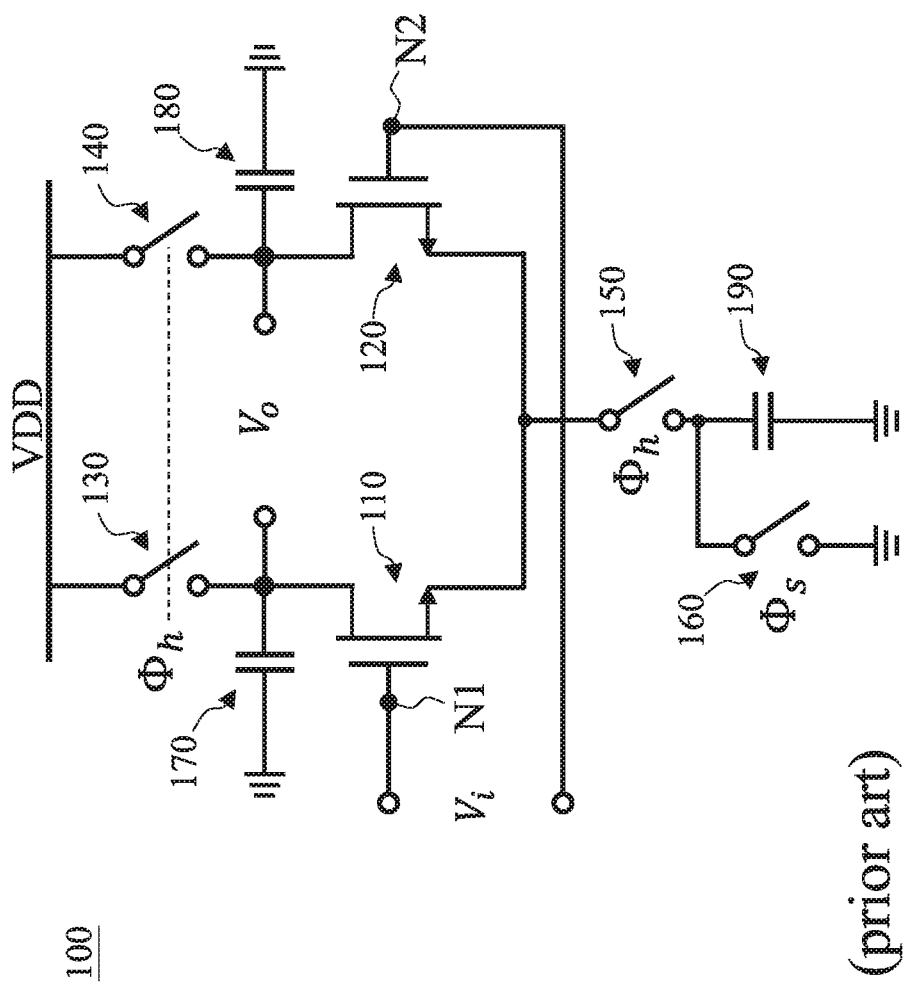
FIG. 1 illustrates a circuit diagram of a conventional charge-steering differential amplifier.
Figure 2A:
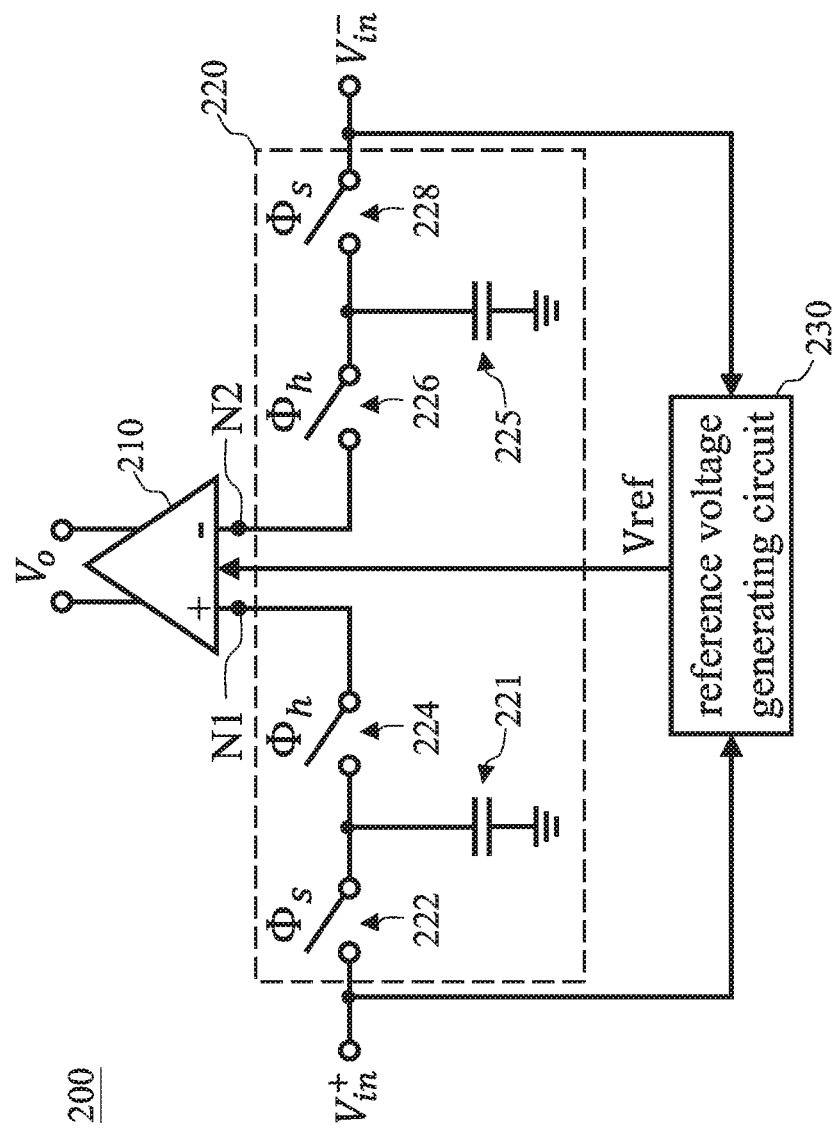
FIG. 2A illustrates a circuit diagram of a charge-steering amplifier circuit according to an embodiment of this disclosure.
Figure 2B:
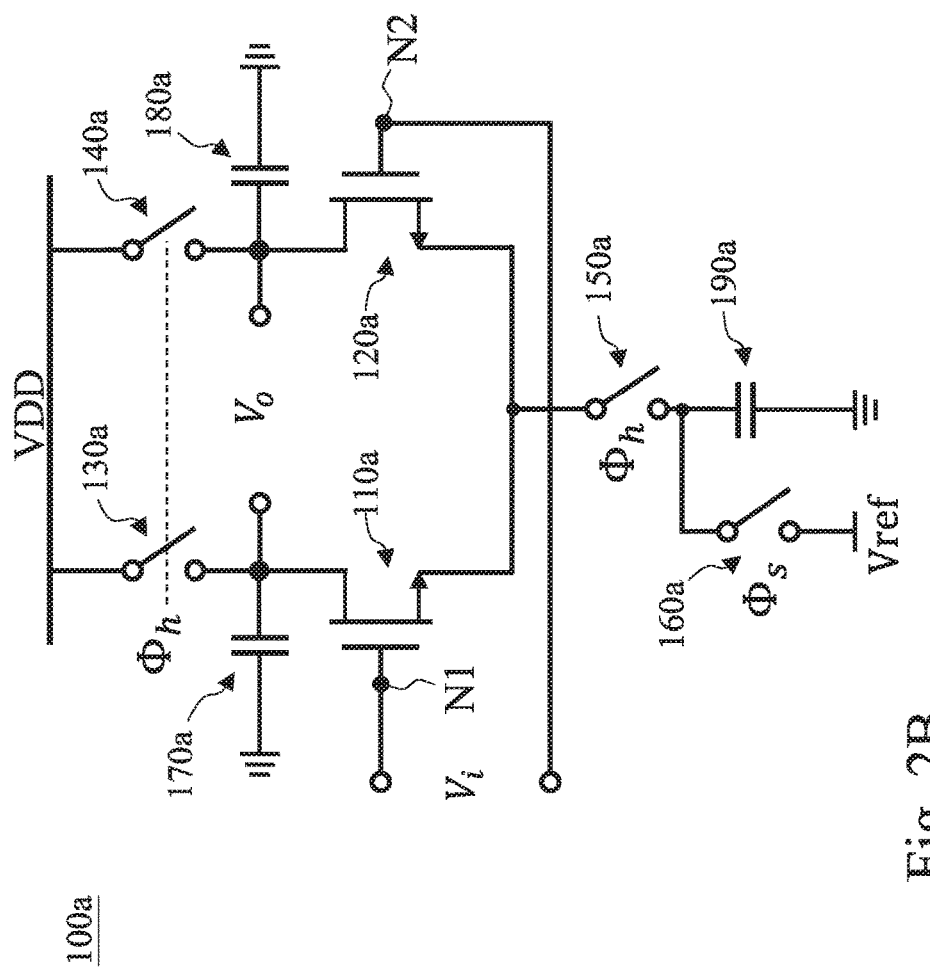
FIG. 2B illustrates a circuit diagram of a charge-steering differential amplifier according to an embodiment of this disclosure.

FIG. 2A is a circuit diagram of a charge-steering amplifier circuit 200 according to an embodiment of this disclosure. The charge-steering amplifier circuit 200 includes a charge-steering differential amplifier 210, a sample and hold circuit 220 and a reference voltage generating circuit 230. The charge-steering differential amplifier 210 may be implemented by a charge-steering differential amplifier 100a of FIG. 2B. The charge-steering differential amplifier 100a mainly includes transistors 110a and 120a, as well as switches 130a to 160a and capacitors 170a to 190a. As shown in FIG. 2B, one end of the switch 160a is coupled to the reference voltage generating circuit 230. More specifically, at the end of the reset phase, the voltage across the capacitor 190a in FIG. 2B would be the reference voltage Vref.

Provided with the capacitors 221, 225, and the switches 222, 224, 226, 228, the sample and hold circuit 220 samples the differential input signal $V_i$ which is made up of the voltage $V_{in}^+$ and the voltage $V_{in}^-$. In the reset phase, the switches 222 and 228 are turned on, while the switches 224 and 226 are turned off. At the end of the reset phase, the voltages across the capacitors 221 and 225 are equal to the voltage $V_{in}^+$ and the voltage $V_{in}^-$, respectively. In the amplification phase, the switches 222 and 228 are turned off, while the switches 224 and 226 are turned on so that the voltage $V_{in}^+$ and the voltage $V_{in}^-$ can be inputted to the charge-steering differential amplifier 210 through the nodes N1 and N2, respectively.

Figure 3:
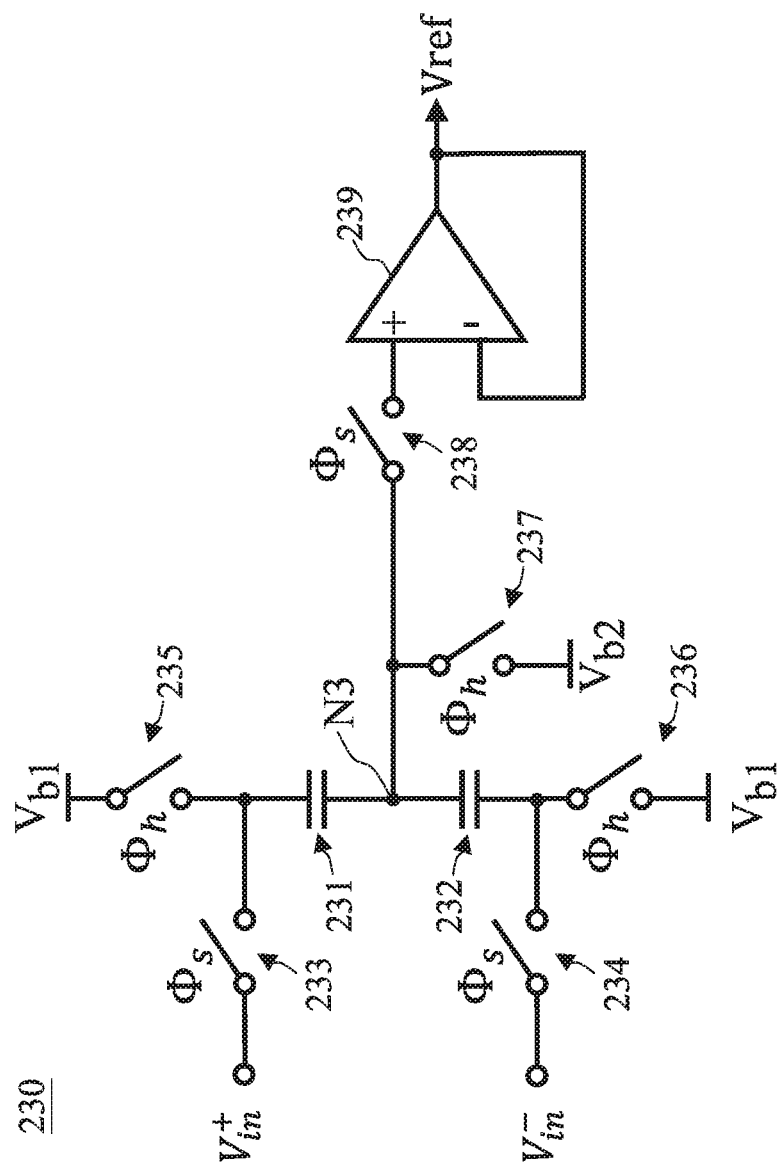
FIG. 3 illustrates a circuit diagram of the reference voltage generating circuit according to an embodiment of this disclosure.
Figure 4:
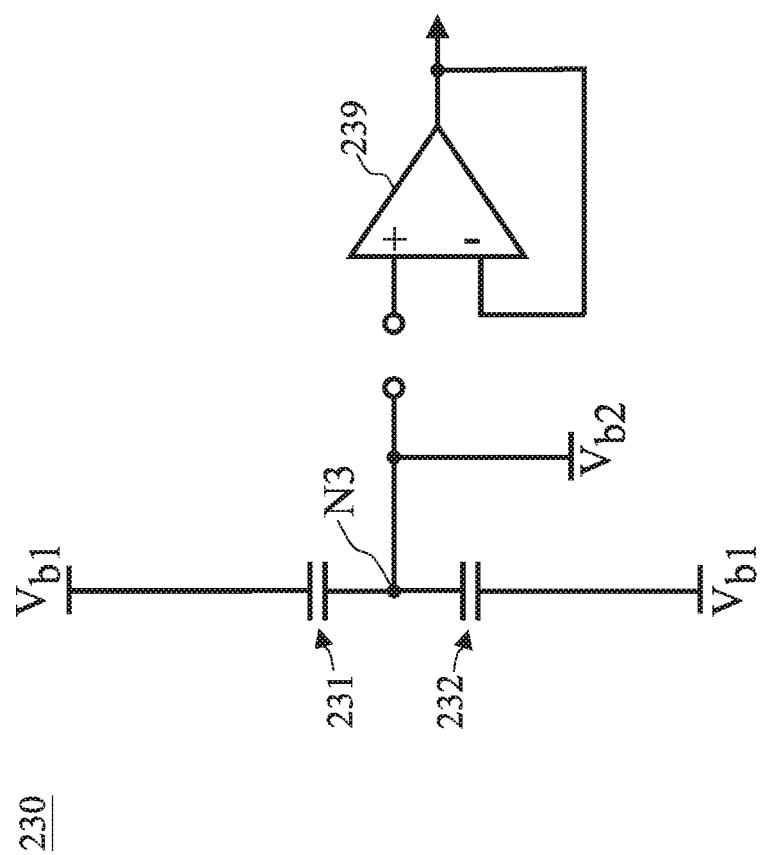
FIG. 4 illustrates a circuit diagram of the reference voltage generating circuit according to an operational state of this disclosure.
Figure 5:
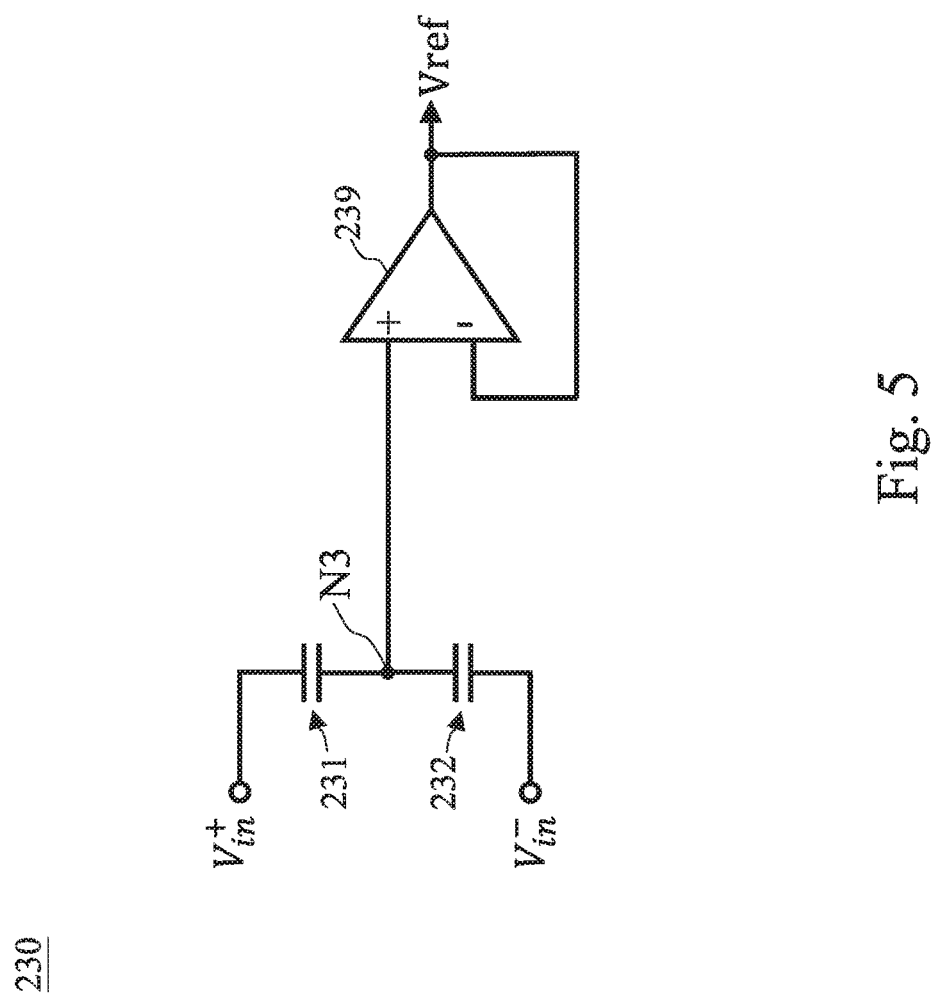
FIG. 5 illustrates a circuit diagram of the reference voltage generating circuit according to another operational state of this disclosure.

FIG. 3 is a circuit diagram of the reference voltage generating circuit 230 according to an embodiment of this disclosure. The reference voltage generating circuit 230 includes capacitors 231 and 232, switches 233 to 238, and a buffer 239. In this example, the buffer 239 is implemented by an operational amplifier, but is not limited thereto. In the amplification phase, the switches 233, 234 and 238 are turned off, while the switches 235, 236 and 237 are turned on, forming a circuit as shown in FIG. 4, where the buffer 239 is idle. At the end of the amplification phase, the voltages across the capacitors 231 and 232 are the difference between the voltage $V_{b1}$ and the voltage $V_{b2}$. In the reset phase, the switches 233, 234 and 238 are turned on, while the switches 235, 236 and 237 are turned off, forming a circuit as shown in FIG. 5. At this point, the voltage at the node N3 is a sum of the common mode voltage $V_{cm}$ of the differential input signal $V_i$ plus the difference between the voltage $V_{b1}$ and the voltage $V_{b2}$. In other words, the reference voltage Vref ($=V_{cm}+V_{b2}-V_{b1}$) outputted by the reference voltage generating circuit 230 in the reset phase is a sum of the common mode voltage ($V_{cm}$) plus a direct current (DC) voltage ($V_{b2}-V_{b1}$). Evidently, the reference voltage Vref is associated with the common mode voltage of the differential input signal $V_i$.

Reference is made back to FIG. 2B. The above-mentioned reference voltage Vref causes the capacitor 190a to have a cross voltage Vref after the reset phase has ended. In the following amplification phase, the gate-source voltage $V_{gs}$ of the transistor 110a is equal to $V_{in}^+$−Vref. That is, $V_{gs}=(v_d+V_{cm})-(V_{cm}+V_{b2}-V_{b1})=v_d-(V_{b2}-V_{b1})$, where $v_d$ is a differential voltage of the differential input signal. The derivation of the gate-source voltage of the transistor 120a is similar to the one of the transistor 110a, and the details are omitted herein for brevity. It can be observed that the gate-source voltages $V_{gs}$ of the transistors 110a and 120a are no longer affected by the perturbation of the common mode voltage. In some embodiments, $|-(V_{b2}-V_{b1})|$ can be preferably designed to be greater than or equal to absolute value of the threshold voltage $V_{th}$ of the transistors 110a and 120a to ensure that the transistors 110a and 120a are turned on. Herein, the transistors 110a and 120a are exemplified by N-type metal-oxide-semiconductor field-effect transistors (MOSFETs), but they may be implemented by P-type MOSFETs as well. The replacement by the P-type MOSFETs is well known to those skilled in the art and is omitted herein for brevity.

In a simulation, the common mode voltage $V_{cm}$ is a sinusoidal signal with a frequency equal to 125 MHz and an amplitude equal to 100 mV. The simulation results show that, for the charge-steering amplifier circuit that does not implement the above mechanism, the signal-to-noise-plus-distortion ratio (SNDR) thereof deteriorates from 48.3 dB (without perturbation in the common mode voltage) to 25.2 dB (with perturbated common mode voltage). In contrast, the SNDR of the charge-steering amplifier circuit according to this disclosure moderately reduces from 48.3 dB to 34.2 dB. Clearly, with the foregoing common mode perturbation cancellation (CMPC) mechanism, the performance of the charge-steering amplifier circuit can be greatly improved.

Figure 6A:
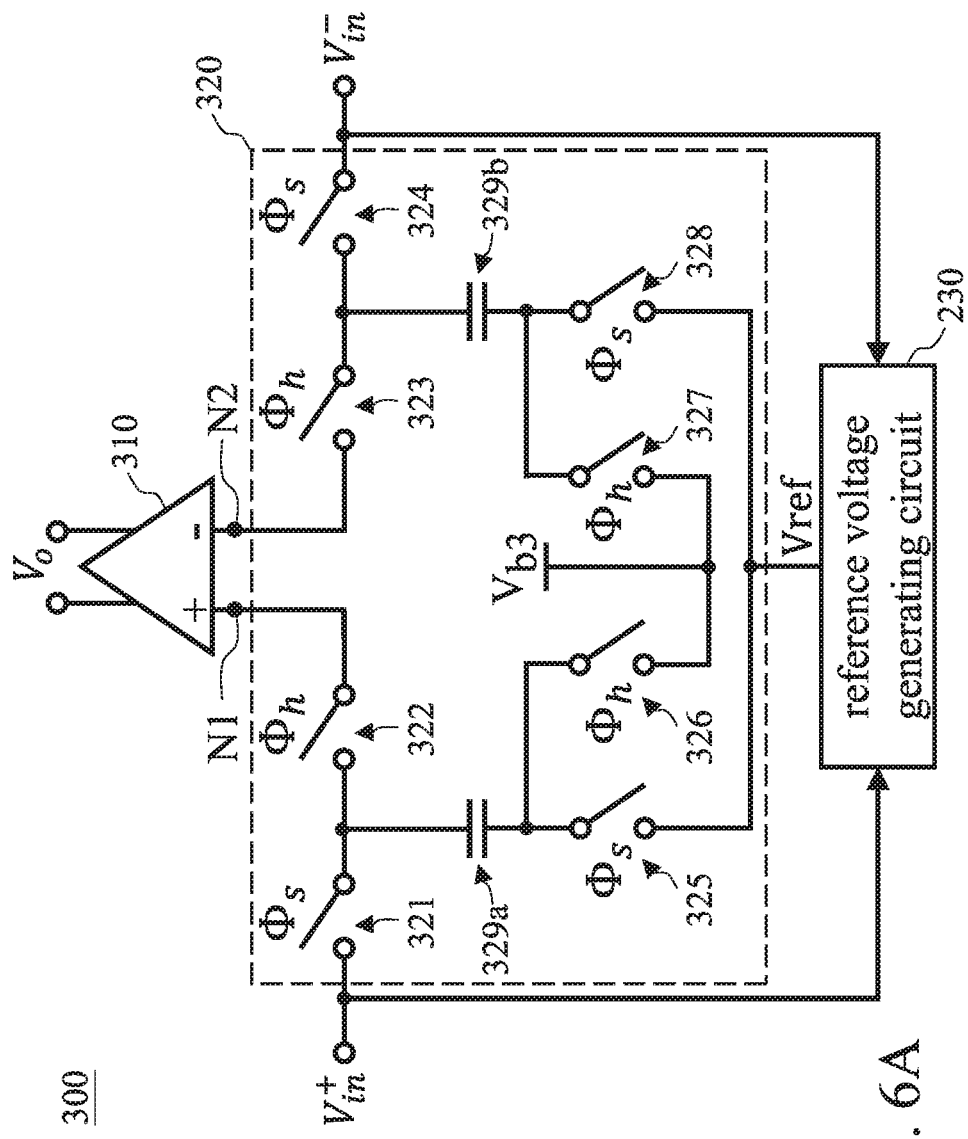
FIG. 6A illustrates a circuit diagram of the charge-steering amplifier circuit according to another embodiment of this disclosure.

FIG. 6A is a circuit diagram of the charge-steering amplifier circuit according to another embodiment of this disclosure. The charge-steering amplifier circuit 300 includes a charge-steering differential amplifier 310, a sample and hold circuit 320 and a reference voltage generating circuit 230. The charge-steering differential amplifier 310 may be implemented by the charge-steering differential amplifier 100b of FIG. 6B. The charge-steering differential amplifier 100b mainly includes transistors 110b and 120b, as well as switches 130b to 160b and capacitors 170b to 190b. Provided with capacitors 329a, 329b, and switches 321-328, the sample and hold circuit 320 samples the differential input signal $V_i$. In the reset phase, the switches 321, 324, 325 and 328 are turned on, while the switches 322, 323, 326, and 327 are turned off so that the two ends of the capacitors 329a and 329b respectively receive the differential input signal $V_i$ and the reference voltage Vref. At the end of the reset phase, the voltage across the capacitor 329a is $\Delta V = V_{in}^+ - Vref = (v_d + V_{cm}) - (V_{cm} + V_{b2} - V_{b1}) = v_d (V_{b2} - V_{b1})$. The derivation of the voltage across the capacitor 329b is similar to the one across the capacitor 329a, and the details are omitted herein for brevity.

In the following amplification phase, the switches 321, 324, 325 and 328 are turned off, while the switches 322, 323, 326, and 327 are turned on so that one of the two ends of each of the capacitors 329a and 329b is coupled to the voltage $V_{b3}$ whereas the other is coupled to the node N1 or N2. At this instant, the input voltage at the input of the charge-steering differential amplifier 310 is $\Delta V + V_{b3} = v_d - (V_{b2} - V_{b1}) + V_{b3}$. It can be observed that, at this instant, the input voltage of the charge-steering differential amplifier 310 is not affected by the common mode voltage perturbation. In some embodiments, $|-(V_{b2}-V_{b1})+V_{b3}|$ can be preferably designed to be greater than or equal to the absolute value of the threshold voltage $V_{th}$ of the transistors 110b and 120b to ensure that the transistors 110b and 120b are turned on. For example, $V_{b1}$ can be designed to be equal to $V_{b2}$ so that the bias voltages of the transistors 110b and 120b can be adjusted by simply modifying the voltage $V_{b3}$. That is, $|V_{b3}|$ is designed to be greater than or equal to the absolute value of the threshold voltage $V_{th}$ of the transistors 110b and 120b.

By implementing the above-mentioned common mode perturbation cancellation mechanism, the performance of the charge-steering amplifier circuit can be greatly enhanced.

To sum up, this disclosure presents a common mode perturbation cancellation mechanism that eliminates the common mode perturbations by extracting the common mode voltage of the differential input signal and then sending in a feedforward manner the common mode voltage to the charge-steering differential amplifier or the sample and hold circuit of the charge-steering amplifier circuit. The conventional feedback approach (such as common mode feedback (CMFB)) resolves the perturbation of the common mode voltage from the output of the charge-steering differential amplifier, and then adjusts the bias state of the transistors by feedback according to the degree of perturbation. More specifically, the feedback approach uses the output signal of the current round (with one round including a reset phase and an immediately-following amplification phase) to reduce the common mode voltage perturbation of the next round. Unfortunately, the feedback approach is ineffective because the perturbated input common mode voltage in any case affects the gain of the current round of the amplifier circuit. In contrast, the feedforward approach presented in this disclosure uses the input signal of the current round to eliminate the common mode voltage perturbation of the current round. As a result, the signal processed by the charge-steering differential amplifier is ideally free from the common mode voltage perturbation, and thus the stability of the gain of the charge-steering differential amplifier is improved.

Figure 6B:
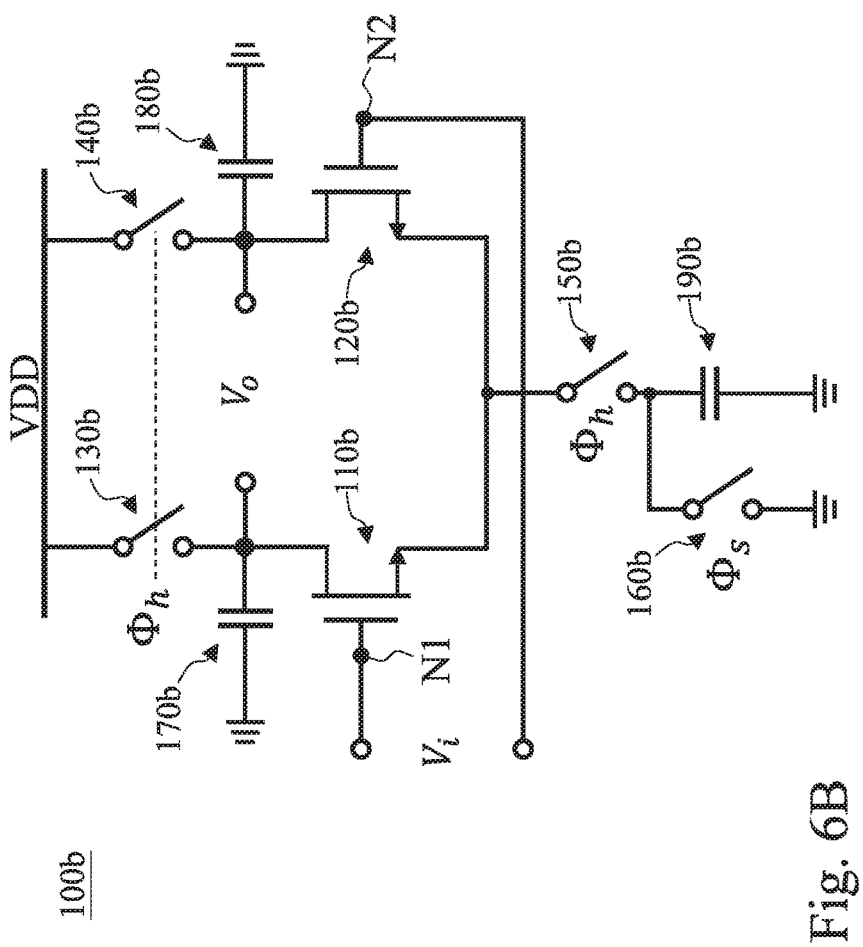
FIG. 6B illustrates a circuit diagram of a charge-steering differential amplifier according to another embodiment of this disclosure.

The embodiment of FIG. 6A of this disclosure can also be applied to (1) a charge-steering differential amplifier similar to the one in FIG. 6B in which the transistors 110b and 120b are biased by a current source; and (2) a charge-steering differential amplifier similar to the one in FIG. 6B in which the transistors 110b and 120b are directly coupled to a reference electric potential (e.g., the sources of the transistors 110b and 120b are directly grounded). The operational details of the above modifications (1) and (2) are omitted herein for brevity.

Figure 7:
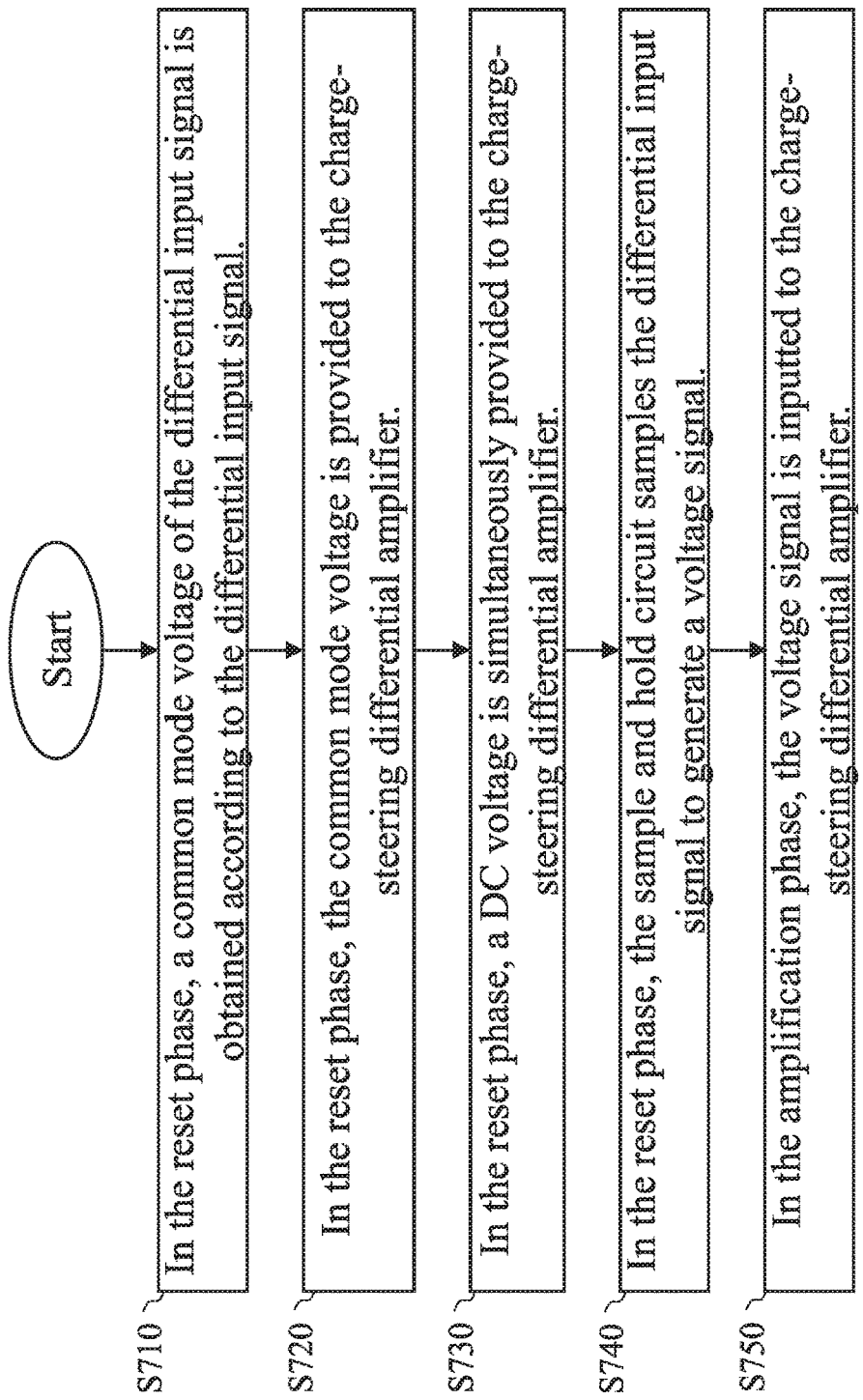
FIG. 7 illustrates a flow chart of a control method of a charge-steering amplifier circuit according to an embodiment of this disclosure.

In addition to the foregoing charge-steering amplifier circuit, this disclosure also discloses a control method of a charge-steering amplifier circuit. FIG. 7 is a flow chart of an embodiment of the method, which may be executed by the foregoing charge-steering amplifier circuit 200 or an equivalent device. The method includes the following steps.

In step S710, in the reset phase, a common mode voltage of the differential input signal is obtained according to the differential input signal. For example, the common mode voltage is obtained by the reference voltage generating circuit 230 of FIG. 3.

In step S720, in the reset phase, the common mode voltage is provided to the charge-steering differential amplifier. More specifically, the charge-steering differential amplifier includes at least one transistor and at least one capacitor, and the common mode voltage is provided to one end of the capacitor, with that one end of the capacitor coupled to a source of the transistor.

In step S730, in the reset phase, a DC voltage is simultaneously provided to the charge-steering differential amplifier. More specifically, the DC voltage is simultaneously provided to the capacitor, so that the same end of the capacitor receives the common mode voltage and the DC voltage at the same time.

In step S740, in the reset phase, the sample and hold circuit samples the differential input signal to generate a voltage signal.

In step S750, in the amplification phase, the voltage signal is inputted to the charge-steering differential amplifier.

From the foregoing descriptions of the charge-steering amplifier circuit 200, people skilled in the art can appreciate the operational details of the flow of FIG. 7 and other corresponding control steps, and thus the details are omitted herein for brevity.

Figure 8:
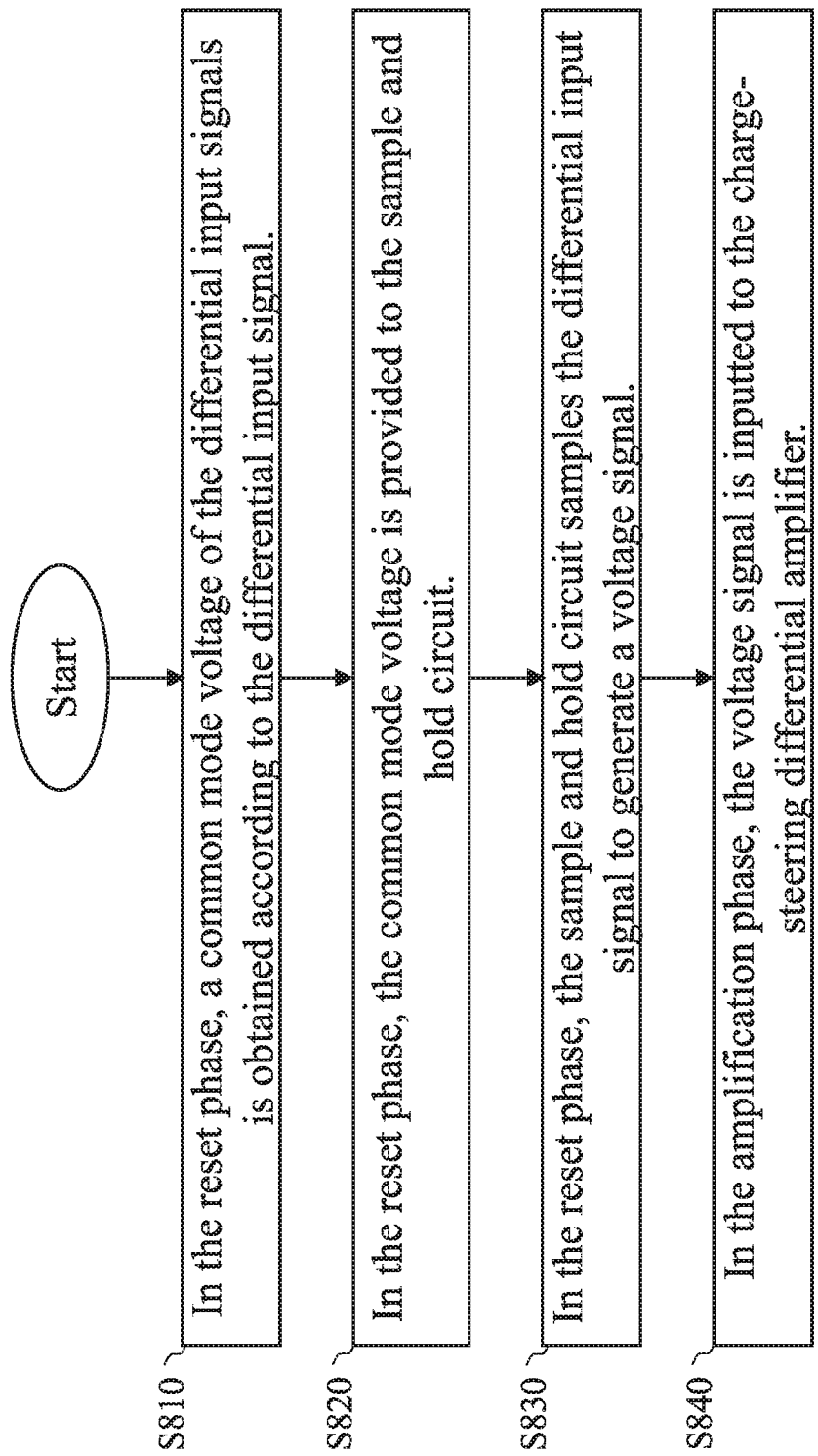
FIG. 8 illustrates a flow chart of a control method of a charge-steering amplifier circuit according to another embodiment of this disclosure.

FIG. 8 is a flow chart of an embodiment of the method, which may be executed by the foregoing charge-steering amplifier circuit 300 or an equivalent device. The method includes the following steps.

In step S810, in the reset phase, a common mode voltage of the differential input signals is obtained according to the differential input signal. For example, the common mode voltage is obtained by the reference voltage generating circuit 230 of FIG. 3.

In step S820, in the reset phase, the common mode voltage is provided to the sample and hold circuit.

In step S830, in the reset phase, the sample and hold circuit samples the differential input signal to generate a voltage signal.

In step S840, in the amplification phase, the voltage signal is inputted to the charge-steering differential amplifier.

From the foregoing descriptions of the charge-steering amplifier circuit 300, people skilled in the art can appreciate the operational details of the flow of FIG. 8 and other corresponding control steps, and thus the details are omitted herein for brevity.

Since people of ordinary skill in the art can appreciate the implementation detail and the modification thereto of the present method embodiments through the disclosure of the device embodiments, repeated and redundant description is thus omitted. Please note that there is no step sequence limitation for the method embodiments as long as the execution of each step is applicable. Furthermore, the shape, size, and ratio of any element and the step sequence of any flow chart in the disclosed figures are exemplary for understanding, not for limiting the scope of this disclosure.

The aforementioned descriptions represent merely the preferred embodiments of the present disclosure, without any intention to limit the scope of the present disclosure thereto. Various equivalent changes, alterations, or modifications based on the claims of the present disclosure are all consequently viewed as being embraced by the scope of the present disclosure.

What is claimed is:

1. A charge-steering amplifier circuit operating in a reset phase or in an amplification phase to amplify a differential input signal, comprising:
   a sample and hold circuit, comprising a capacitor, sampling said differential input signal to generate a voltage signal;
   a charge-steering differential amplifier comprising:
      a transistor having a first end receiving said voltage signal and a second end serving as an output terminal of said charge-steering differential amplifier;
      a switch which is turned off in said reset phase and turned on in said amplification phase; and
      a capacitor which is coupled to a third end of said transistor through said switch; and
   a reference voltage generating circuit, coupled to said charge-steering differential amplifier, for generating a reference voltage according to said differential input signal and outputting said reference voltage to said capacitor in said reset phase;
   wherein, said reference voltage is associated with a common mode voltage of said differential input signal.

2. The charge-steering amplifier circuit of claim 1, wherein said reference voltage is a sum of said common mode voltage plus a direct current (DC) voltage.

3. The charge-steering amplifier circuit of claim 2, wherein an absolute value of said DC voltage is greater than an absolute value of a threshold voltage of said transistor.

4. A charge-steering amplifier circuit operating in a reset phase or in an amplification phase to amplify a differential input signal, comprising:
   a charge-steering differential amplifier receiving a voltage signal through an input terminal;
   a sample and hold circuit, coupled to said charge-steering differential amplifier and sampling said differential input signal to generate said voltage signal, comprising:
      a capacitor having a first end and a second end; and
      multiple switches which are turned on or off according to said reset phase and said amplification phase; and
   a reference voltage generating circuit, coupled to said sample and hold circuit for generating a first reference voltage according to said differential input signal, said first reference voltage being associated with a common mode voltage of said differential input signal;
   wherein, in said reset phase, said first end of said capacitor receives said differential input signal and said second end of said capacitor is coupled to said first reference voltage, and in said amplification phase, said first end of said capacitor is coupled to said input terminal and said second end of said capacitor is coupled to a second reference voltage.

5. The charge-steering amplifier circuit of claim 4, wherein said first reference voltage is equal to said common mode voltage of said differential input signal.

6. The charge-steering amplifier circuit of claim 5, wherein said charge-steering differential amplifier comprises a transistor having a first end serving as said input terminal and a second end serving as an output terminal of said charge-steering differential amplifier, and an absolute value of said second reference voltage is greater than an absolute value of a threshold voltage of said transistor.

7. The charge-steering amplifier circuit of claim 4, wherein said first reference voltage is equal to a sum of said common mode voltage of said differential input signal plus a direct current (DC) voltage.

8. The charge-steering amplifier circuit of claim 7, wherein said charge-steering differential amplifier comprises a transistor having a first end serving as said input terminal and a second end serving as an output terminal of said charge-steering differential amplifier, and an absolute value of a sum of said second reference voltage plus said DC voltage is greater than an absolute value of a threshold voltage of said transistor.

9. A control method of a charge-steering amplifier circuit, said charge-steering amplifier circuit comprising a charge-steering differential amplifier and a sample and hold circuit, and operating in a reset phase or in an amplification phase to amplify a differential input signal, said method comprising:
   in said reset phase, obtaining a common mode voltage of said differential input signal according to said differential input signal;
   in said reset phase, providing said common mode voltage to one of said charge-steering differential amplifier and said sample and hold circuit;
   in said reset phase, using said sample and hold circuit to sample said differential input signal to generate a voltage signal; and
   in said amplification phase, inputting said voltage signal to said charge-steering differential amplifier.

10. The control method of claim 9, wherein said charge-steering differential amplifier comprises a capacitor, and when said common mode voltage is provided to said charge-steering differential amplifier in said reset phase, said method further comprises:
   simultaneously providing a direct current (DC) voltage to an end of said capacitor that receives said common mode voltage.

* * * * *